(12) United States Patent
Gaxiola et al.

(10) Patent No.: US 9,478,974 B2
(45) Date of Patent: Oct. 25, 2016

(54) DC VOLTAGE CIRCUIT BREAKER

(75) Inventors: Enrique Gaxiola, Aix en Provence (FR); Jakob Vogelsang, Fuerth (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 98 days.

(21) Appl. No.: 14/348,739

(22) PCT Filed: Sep. 5, 2012

(86) PCT No.: PCT/EP2012/067276
§ 371 (c)(1),
(2), (4) Date: Mar. 31, 2014

(87) PCT Pub. No.: WO2013/045238
PCT Pub. Date: Apr. 4, 2013

(65) Prior Publication Data
US 2014/0233140 A1    Aug. 21, 2014

(30) Foreign Application Priority Data
Sep. 29, 2011   (DE) .......... 10 2011 083 693

(51) Int. Cl.
*H02H 7/26* (2006.01)
*H02H 3/087* (2006.01)
*H01H 33/59* (2006.01)
*H03K 17/13* (2006.01)
*H03K 17/18* (2006.01)

(52) U.S. Cl.
CPC ........... *H02H 7/268* (2013.01); *H01H 33/596* (2013.01); *H02H 3/087* (2013.01); *H03K 17/13* (2013.01); *H03K 17/18* (2013.01)

(58) Field of Classification Search
CPC .... H01H 33/596; H02H 7/268; H02H 3/087; H03K 5/153
USPC .............................................. 361/4
See application file for complete search history.

(56) References Cited

U.S. PATENT DOCUMENTS

| | | | |
|---|---|---|---|
| 3,476,978 A | 11/1969 | Greenwood | |
| 4,110,806 A * | 8/1978 | Murano | H01F 38/023 307/135 |
| 4,740,858 A * | 4/1988 | Yamaguchi | H01H 33/596 361/3 |
| 4,805,062 A | 2/1989 | Shirouzu et al. | |
| 5,121,281 A | 6/1992 | Pham et al. | |
| 5,214,557 A * | 5/1993 | Hasegawa | H01H 33/596 361/11 |
| 5,452,170 A * | 9/1995 | Ohde | H01H 33/596 174/DIG. 17 |

(Continued)

FOREIGN PATENT DOCUMENTS

| | | |
|---|---|---|
| DE | 1812599 A1 | 7/1969 |
| DE | 3734989 A1 | 4/1988 |

(Continued)

*Primary Examiner* — Stephen W Jackson
*Assistant Examiner* — Christopher Clark
(74) *Attorney, Agent, or Firm* — Laurence Greenberg; Werner Stemer; Ralph Locher (57) ABSTRACT

A DC voltage circuit breaker includes a first to fourth nodes, a first interrupter disposed between the first node and the fourth node, a second interrupter disposed between the fourth node and the third node, a pulse generator circuit disposed between the fourth node and the second node, the pulse generator circuit having a capacitor connected in parallel with a series circuit of an inductor and a switch, and a first energy absorber disposed between the third node and the second node.

7 Claims, 6 Drawing Sheets

(56) References Cited

U.S. PATENT DOCUMENTS

| | | | | |
|---|---|---|---|---|
| 5,517,378 A | * | 5/1996 | Asplund | H01H 33/596 361/3 |
| 5,666,257 A | | 9/1997 | Yang | |
| 5,737,162 A | | 4/1998 | Ito et al. | |
| 6,149,783 A | * | 11/2000 | Signer | C23C 14/32 118/723 E |
| 8,995,097 B2 | * | 3/2015 | Skarby | H02H 3/087 361/2 |
| 2014/0055903 A1 | * | 2/2014 | Juhlin | H02H 7/222 361/115 |
| 2014/0226247 A1 | * | 8/2014 | Gaxiola | H01H 33/596 361/100 |
| 2014/0299579 A1 | * | 10/2014 | Hartmann | H01H 33/596 218/145 |
| 2015/0022928 A1 | * | 1/2015 | Mohaddes Khorassani | H02H 3/087 361/93.7 |

FOREIGN PATENT DOCUMENTS

| | | |
|---|---|---|
| EP | 0431510 A1 | 6/1991 |
| EP | 0758137 A1 | 2/1997 |

* cited by examiner

DC VOLTAGE CIRCUIT BREAKER

BACKGROUND OF THE INVENTION

Field of the Invention

The present invention relates to a DC voltage circuit breaker.

Electric energy is generally generated in power plants as three-phase alternating current. For transmission, this energy is transformed to very high electric AC voltages by power transformers and transmitted via overhead lines. However, in very long overhead lines, transmission of the energy using direct current is associated with lower losses and is therefore more advantageous.

However, in the related art, there are problems with direct-current transmission in controlling power flows in mesh line networks. Therefore, for direct-current transmission, point-to-point connections without branches or meshes have been used almost exclusively up to now. However, construction and expansion of direct-current line networks is planned for the future. For this purpose, DC voltage circuit breakers are required in order to increase the availability of the planned direct-current line networks. DC voltage circuit breakers are used to selectively disconnect portions of a line network in the event of an incident, thereby preventing a failure of the entire line network.

BRIEF SUMMARY OF THE INVENTION

The object of the present invention is to provide an improved DC voltage circuit breaker. This object is achieved using a DC voltage circuit breaker having the following features:

The DC voltage circuit breaker according to the present invention comprises a first through fourth node, wherein
- a first interrupter is situated between the first node and the fourth node,
- a second interrupter is situated between the fourth node and the third node,
- a pulse generator circuit is situated between the fourth node and the second node, the pulse generator circuit comprising a parallel connection of a capacitor with a series circuit made up of an inductor and a switch,
- a first energy absorber is situated between the third node and the second node.

A first DC voltage may be applied between the first node and the second node, and a second DC voltage may be tapped between the third node and the second node. The switch may be a semiconductor switch, for example, a bipolar transistor having an insulated gate electrode (IGBT) or a thyristor (three-terminal semiconductor rectifier, SCR).

For the present invention, it has been found that with suitable control, the pulse generator circuit allows forcing of a current zero-crossing very rapidly. This forced zero crossing advantageously allows a disconnection of the line that is protected by the DC voltage circuit breaker. This advantageously enables an embodiment of the DC voltage circuit breaker having a low number of switching elements, and shortens the maximum required time for complete current interruption and selective disconnection of a portion of a line network.

A flyback diode is advantageously situated in series with the first energy absorber, in order to maintain a separation between the third node and the second node under normal voltage conditions.

The pulse generator circuit preferably comprises a resistor and a second diode in series with the parallel circuit. In addition, the pulse generator circuit preferably comprises a second varistor in parallel with the parallel circuit and the resistor.

The DC voltage circuit breaker preferably comprises a control device that is designed to carry out the following steps in the event of a disconnection:
- switching on the thyristor;
- opening the second interrupter;
- opening the first interrupter.

In one preferred specific embodiment of the DC voltage circuit breaker, the first interrupter is merely a simple disconnector or alternatively an SF6 interrupter. SF6 interrupters are advantageously suitable for interrupting very large voltages. The second interrupter is preferably a hybrid interrupter. The second interrupter preferably contains a vacuum interrupter. Vacuum interrupters are advantageously suitable for high switching rates and are largely maintenance-free.

BRIEF DESCRIPTION OF THE SEVERAL VIEWS OF THE DRAWING

The above-described characteristics, features, and advantages of this invention, as well as the manner in which they are achieved, will be understood more clearly and explicitly in connection with the following description of the exemplary embodiments, which are described in greater detail in connection with the drawings.

DESCRIPTION OF THE INVENTION

Figure 1:
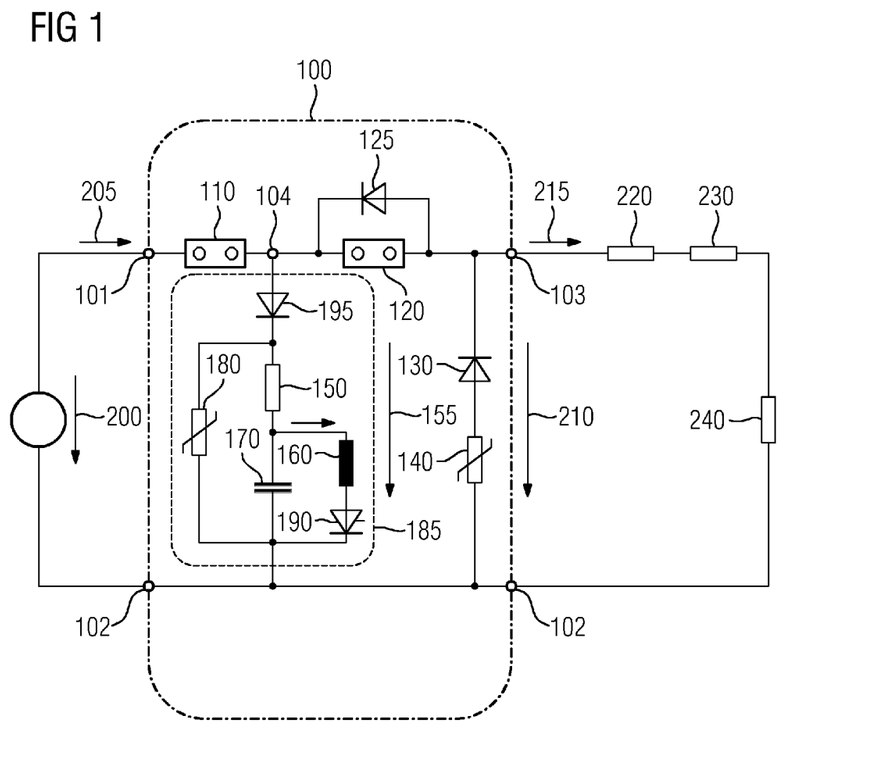
FIG. 1 shows a circuit arrangement of a DC voltage circuit breaker.
Figure 2:
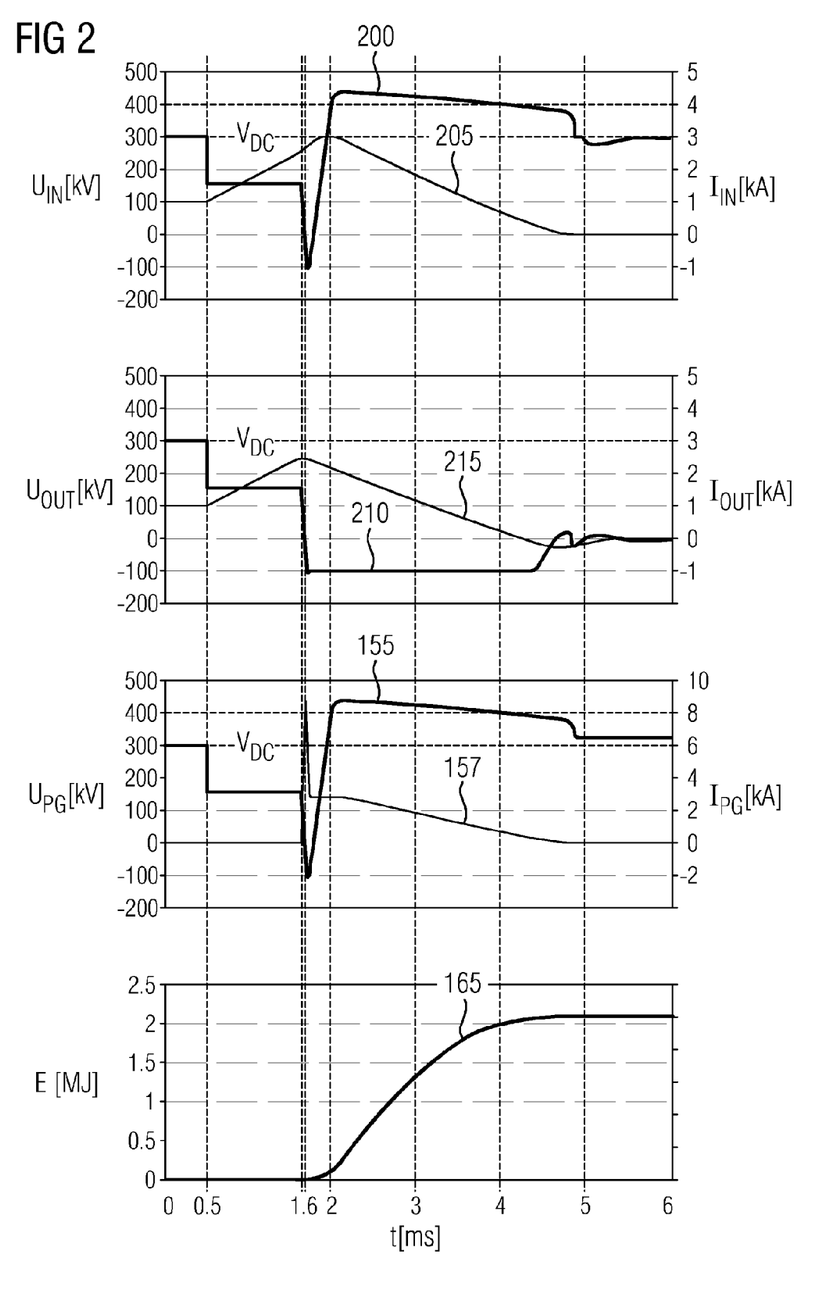
FIG. 2 through FIG. 5 show diagrams for current and voltage profiles when disconnecting a short circuit.
Figure 3:
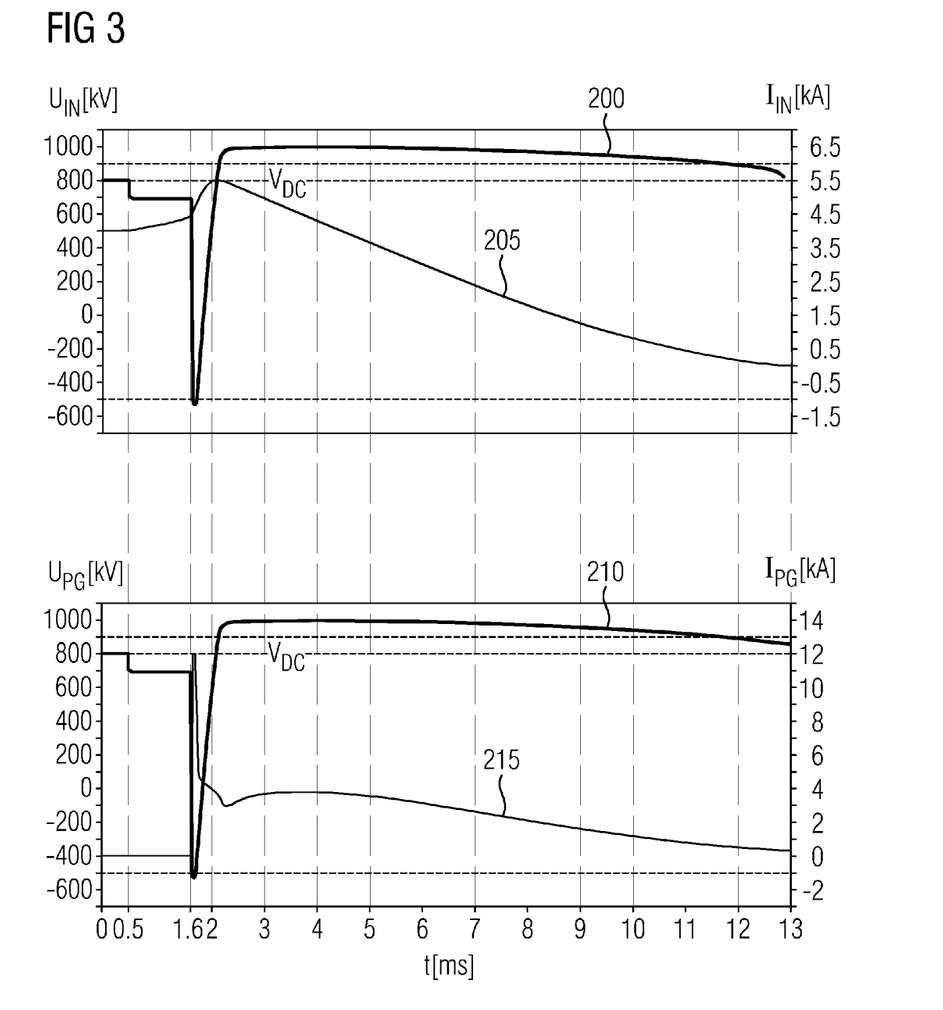
Figure 4:
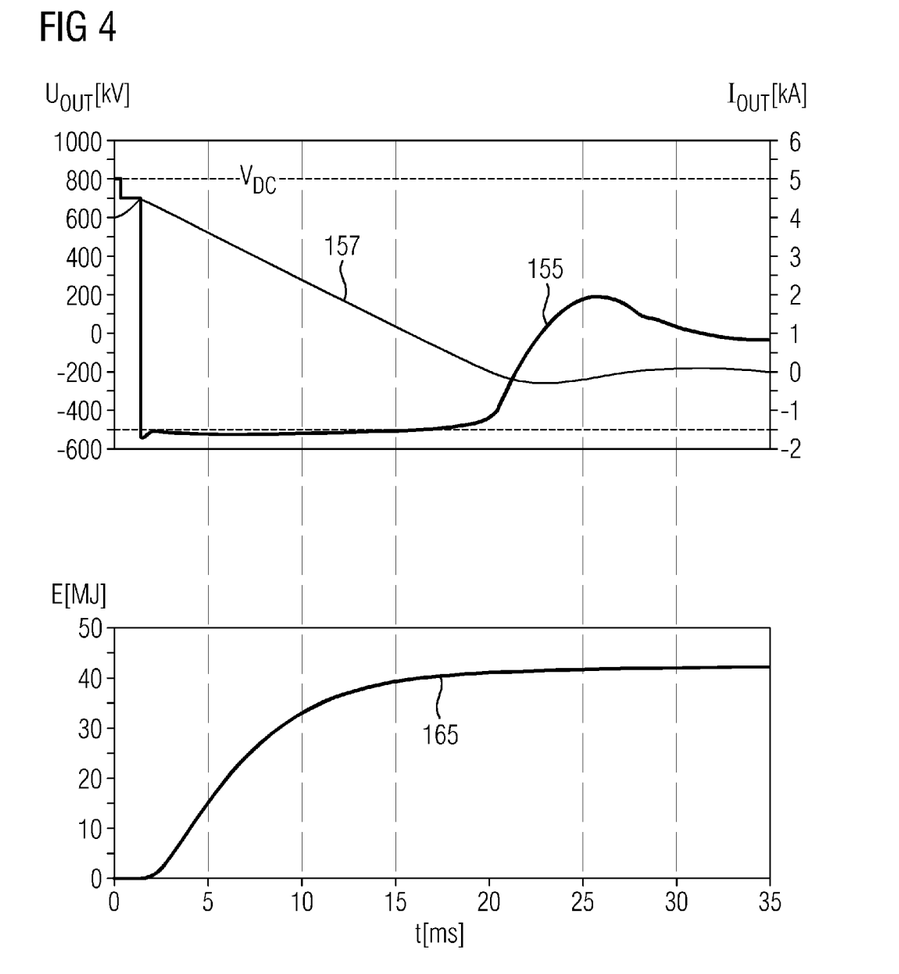
Figure 5:
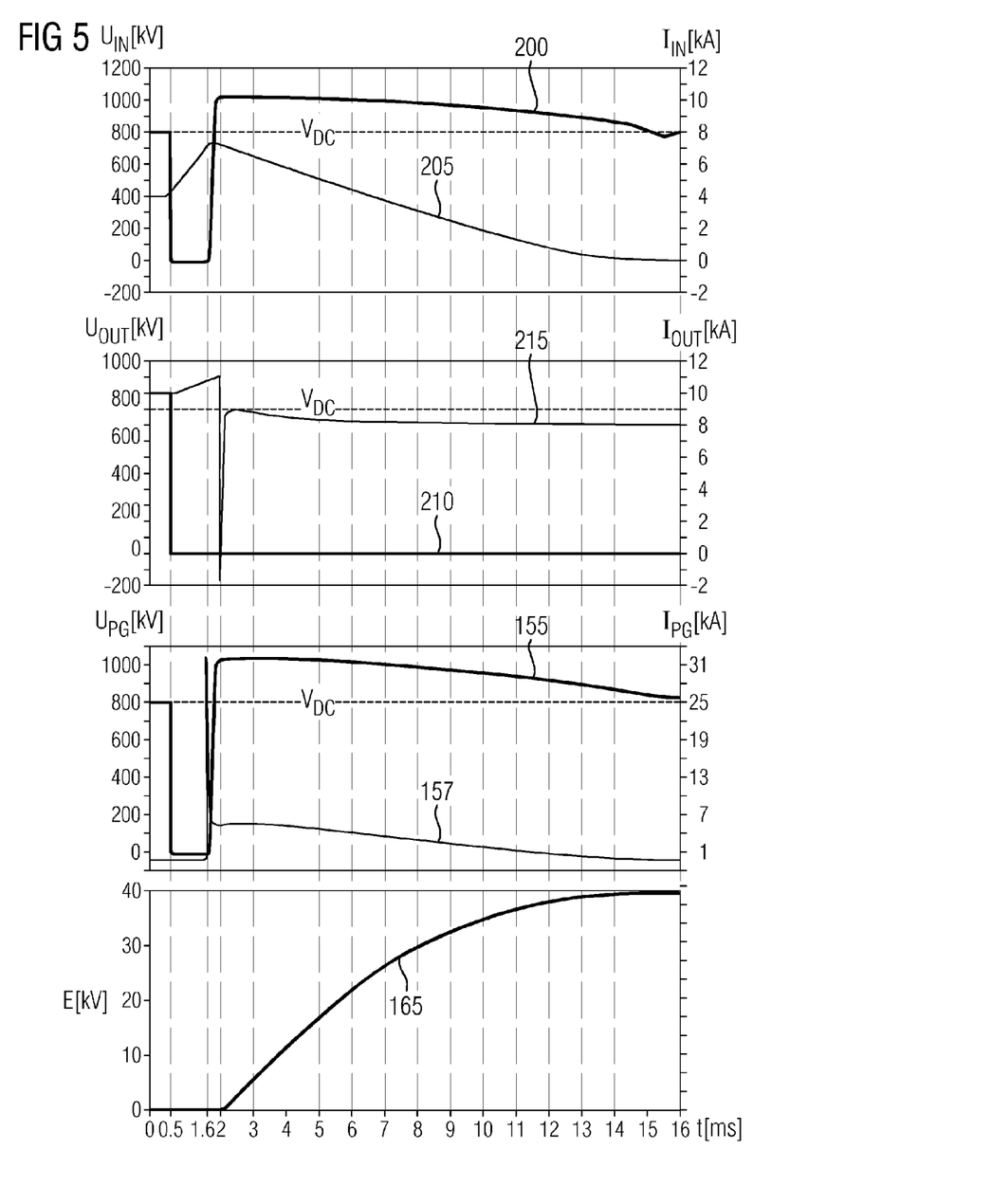

FIG. 1 shows a circuit arrangement of a DC voltage circuit breaker 100. The DC voltage circuit breaker may be integrated into a direct-current line network in order to selectively disconnect a portion of the direct-current line network in the event of a short circuit. The DC voltage circuit breaker 100 may, for example, be provided for use in a high-voltage direct-current line network. In a direct-current line network, the DC voltage circuit breaker 100 enables protection of the positive phase from ground potential, of the negative phase from ground potential, and of the positive phase from the negative phase.

The DC voltage circuit breaker 100 has a first through fourth node 101 . . . 104. The nodes 101 . . . 104 are circuit nodes of the DC voltage circuit breaker 100, which are each at an electric potential. Thus, the nodes 101 . . . 104 may each also comprise electric line sections if the electric resistances of these line sections are negligible.

A DC voltage 200 may be applied between the first node 101 and the second node 102 of the DC voltage circuit breaker 100. The DC voltage 200 may be a source voltage that is applied by a high-voltage rectifier to a direct-current line network. In this case, the first node 101 and the second node 102 form an input side of the DC voltage circuit breaker 100 and the direct-current line network connecting to the DC voltage circuit breaker 100. The DC voltage 200 applied between the first node 101 and the second node 102 may, for example, be 500 kV. However, the DC voltage 200 may also assume higher voltage values of more than 1200 kV. The DC voltage 200 may induce a direct current of 20 kA or more in the direct-current line network in which the DC voltage circuit breaker 100 is used.

An output voltage 210 may be tapped between the third node 103 and the second node 102 of the DC voltage circuit breaker 100. The output voltage 210 is a DC voltage and essentially corresponds to the DC voltage 200 applied between the first node 101 and the second node 102. However, in the event of a short circuit, the DC voltage circuit breaker 100 may break the connection between the first node 101 and the third node 103, so that the output voltage 210 no longer corresponds to the DC voltage 200.

Line portions of the direct-current line network may connect at the third node 103 and the second node 102 by using the DC voltage circuit breaker 100. These portions of the direct-current line network are schematically depicted in FIG. 1 by a line impedance 220, a line resistance 230, and a load resistance 240.

An auxiliary interrupter 110 is situated between the first node 101 and the fourth node 104. In the event of a short circuit, the auxiliary interrupter 110 serves to break an electric connection between the first node 101 and the fourth node 104.

The DC voltage circuit breaker 100 has a hybrid interrupter 120 between the fourth node 104 and the third node 103. In the event of a short circuit, the hybrid interrupter 120 serves to break the electric connection between the fourth node 104 and the third node 103.

The auxiliary interrupter 110 and the hybrid interrupter 120 are able to break the electric connection between the first node 101 and the third node 103 only if an electric current flowing between the first node 101 and the third node 103 is small, i.e., approaches the value zero. Otherwise, the non-extinguishable formation of arcs occurs during the breaking of the connection between the first node 101 and the third node 103, which may damage or destroy the auxiliary interrupter 110, the hybrid interrupter 120, the entire DC voltage circuit breaker 100, or other portions of a direct-current line network. Thus, in the event of a short circuit, the electric current flowing between the first node 101 and the third node 103 must be lowered to zero within an extremely short time in order for the auxiliary interrupter 110 and the hybrid interrupter 120 to be able to interrupt the electrical connection between the first node 101 and the third node 103. For this purpose, the DC voltage circuit breaker 100 has a pulse generator circuit 185 that is situated between the fourth node 104 and the second node 102.

Furthermore, the DC voltage circuit breaker 100 has a series circuit made up of a flyback diode 130 and a metal-oxide varistor 140 between the third node 103 and the second node 102. The flyback diode 130 is situated at the third node 103 in a blocking manner with respect to the normally positive DC voltage.

The pulse generator circuit 185 of the DC voltage circuit breaker 100 comprises a resistor 150, a coil 160, a capacitor 170, a thyristor 190, and a second metal-oxide varistor 180. On the one hand, the capacitor 170 and a series circuit made up of the coil 160 and the thyristor 190 form a parallel circuit. For its part, this parallel circuit is connected in series with the resistor 150. The series made up of the resistor and the parallel circuit is in turn situated in parallel with the second metal-oxide varistor 180. A second diode 195 is upstream of the aforementioned elements in series with the fourth node 104. The second diode 195 is arranged conductively for the normally positive DC voltage at the fourth node 104. The pulse generator circuit 185 serves to generate a reverse electric current through the vacuum interrupter 120 that is directed opposite to the normal current flow by the hybrid interrupter 120 and compensates for it. The pulse generator circuit 185 thus causes a zero crossing of the current flow through the hybrid interrupter 120 that enables the hybrid interrupter 120 to interrupt the electric connection between the first node 101 and the fourth node 104, thus also breaking the electric connection between the first node 101 and the third node 103.

The metal-oxide varistors 140, 180 serve to absorb the energy 165 released in the event of a short circuit and an interruption caused by the DC voltage circuit breaker 100.

In the normal operation of the DC voltage circuit breaker 100, the thyristor 190 of the DC voltage circuit breaker 100 is open. Current flow between the first node 101 and the third node 103 is possible via the auxiliary interrupter 110 and the hybrid interrupter 120. If a short circuit occurs in the direct-current line network in which the DC voltage circuit breaker 100 is used, the electric current flowing through the DC voltage circuit breaker 100 increases sharply. This is detected via a detection device that is not depicted in FIG. 1. If an excessive rise of the electric current flowing in the DC voltage circuit breaker 100 is detected, a disconnection is carried out.

An exemplary flow diagram is specified below:

First period from 0 ms to 0.5 ms: the network functions normally.

Second period from 0.5 ms to 1.6 ms: a short circuit occurs in the network and the current increases essentially linearly, the increase being a function of the line impedance 220.

Third period from 1.6 ms to 1.64 ms: the short circuit is detected and confirmed. The hybrid interrupter 120 is opened. The thyristor 190 is switched on via the control of the DC voltage circuit breaker 100. As a result, the capacitor 170 discharges via the coil 160, which results in a reversed voltage 155 across the pulse generator circuit 185 relative to the normal conditions in the DC voltage circuit breaker 100. Since the arc voltage is normally comparatively low (8 V to 80 V), the DC voltage 200 and the output voltage 210 initially have practically the same magnitude. The voltage subsequently falls to the value of the threshold voltage of the metal-oxide varistor 140.

Fourth period from 1.64 ms to 1.68 ms: If the threshold voltage of the metal-oxide varistor 140 has been reached, the current 157 commutates through the pulse generator circuit 185 to the metal-oxide varistor 140 and to the hybrid interrupter 120. If the pulse generator circuit 185 is suitably designed, the current through the hybrid interrupter 120 experiences a zero crossing, causing the arc to be extinguished, thus finally interrupting the current. In order to cause the zero crossing, the peak value of the current 157 through the pulse generator circuit 185 must correspond at least to the current otherwise flowing through the hybrid interrupter 120. The source current 205 subsequently charges the capacitor 170 again up to the threshold voltage of the second metal-oxide varistor 180.

Fifth period from 1.68 ms to 4.9 ms: The magnetically stored energy 165 is dissipated in the second metal-oxide varistor 180, and the source current 205 has a zero crossing at instant t5, and the DC voltage circuit breaker 100 is able to carry out a final disconnection, for example, by opening the auxiliary interrupter 110. If the circuit breaker 100 is situated on the busbar, the auxiliary interrupter 110 must satisfy considerably smaller demands. Its use prevents an oscillation of the capacitor 170 after the disconnection process. In addition, it serves to establish a safe isolating distance. The elapsed time for dissipating the energy 165 is a function of the characteristics of the varistors 140, 180. A higher dissipation rate may, for example, be achieved via a parallel connection of multiple varistors 140, 180.

For this purpose, FIGS. 2 through 5 show the profiles of DC voltage 200, source current 205, output voltage 210 and output current 215, voltage 155 across the pulse generator circuit 185 and current 157 through the pulse generator circuit 185, and the dissipated energy 165. The profiles shown in FIG. 3 and FIG. 4 result if a short circuit occurs at a distance of 1000 km. The profiles in FIG. 4 result if a short circuit occurs at a distance of less than 1 km.

Figure 6:
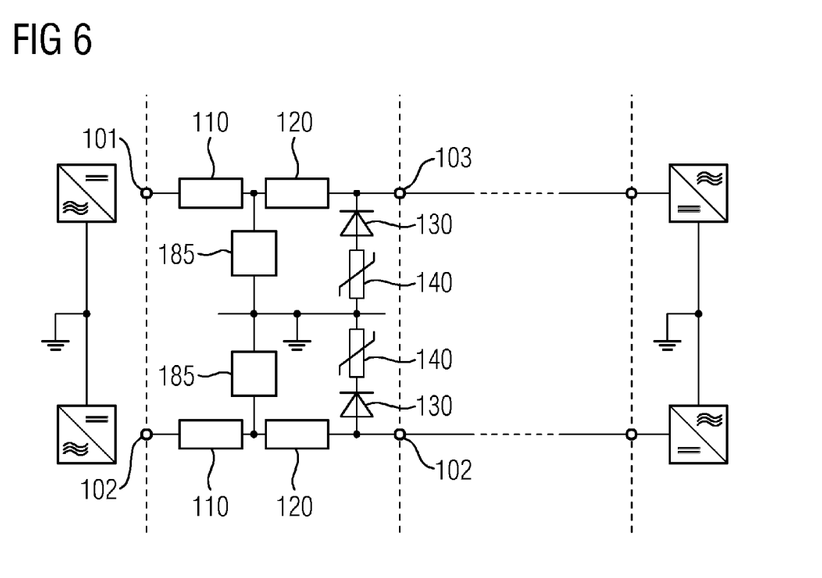
FIG. 6 shows a circuit arrangement of a bipolar DC voltage circuit breaker.

FIG. 6 illustrates a structure in a highly schematic manner for a second DC voltage circuit breaker that is designed for symmetrically monopolar (and bipolar) application cases. The entire second DC voltage circuit breaker 300 is made up of two DC voltage circuit breakers 100 according to FIG. 1. One of these is situated between the positive terminal and ground potential, and the second is situated between the ground potential and the negative terminal.

The DC voltage circuit breaker 100 enables a physical disconnection in a direct-current line network at energies 165 of up to 20 MJ in a period on the order of 10 ms. This corresponds to the usual level in AC voltage line networks. The DC voltage circuit breaker 100 allows the use of direct-current line networks having meshes, i.e., direct-current line networks that do not comprise just a point-to-point connection. The DC voltage circuit breaker 100 is especially advantageously for use in multi-terminal offshore high-voltage feed-in points that use renewable energy sources. The DC voltage circuit breaker 100 may, for example, be used in combination with wind turbines.

The invention claimed is:

1. A DC voltage circuit breaker, comprising:
   a first node, a second node, a third node, and a fourth node;
   a first interrupter connected between said first node and said fourth node;
   a second interrupter connected between said fourth node and said third node;
   a pulse generator circuit connected between said fourth node and said second node, said pulse generator circuit including a capacitor connected in a parallel circuit with a series circuit of an inductor and a switch; and
   a first energy absorber connected between said third node and said second node;
   said capacitor connected to discharge to thereby cause a reverse current to flow through said first energy absorber and into said second interrupter.

2. The DC voltage circuit breaker according to claim 1, which further comprises a flyback diode connected in series with said first energy absorber.

3. The DC voltage circuit breaker according to claim 2, wherein said pulse generator circuit includes a resistor and another diode connected in series with said parallel circuit.

4. The DC voltage circuit breaker according to claim 3, wherein said pulse generator circuit includes a second energy absorber, and said resistor and said parallel circuit are connected in another series circuit connected in parallel with said second energy absorber.

5. The DC voltage circuit breaker according to claim 1, wherein said first interrupter is a simple disconnector or an $SF_6$ interrupter.

6. The DC voltage circuit breaker according to claim 1, wherein said second interrupter is a hybrid interrupter.

7. The DC voltage circuit breaker according to claim 6, wherein said hybrid interrupter contains a vacuum interrupter.

* * * * *